(12) United States Patent
Chan

(10) Patent No.: US 11,735,692 B2
(45) Date of Patent: Aug. 22, 2023

(54) USING A COMPLIANT LAYER TO ELIMINATE BUMP BONDING

(71) Applicant: SRI International, Menlo Park, CA (US)

(72) Inventor: Winston K. Chan, Princeton, NJ (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 17/297,708

(22) PCT Filed: Aug. 22, 2019

(86) PCT No.: PCT/US2019/047760
§ 371 (c)(1),
(2) Date: May 27, 2021

(87) PCT Pub. No.: WO2020/117334
PCT Pub. Date: Jun. 11, 2020

(65) Prior Publication Data
US 2021/0359160 A1 Nov. 18, 2021

Related U.S. Application Data

(60) Provisional application No. 62/775,312, filed on Dec. 4, 2018.

(51) Int. Cl.
*H01L 33/28* (2010.01)
*H01L 31/0296* (2006.01)
(Continued)

(52) U.S. Cl.
CPC ........ *H01L 33/28* (2013.01); *H01L 31/02966* (2013.01); *H01L 31/109* (2013.01);
(Continued)

(58) Field of Classification Search
CPC . H01L 33/28; H01L 31/02966; H01L 31/109; H01L 31/1832; H01L 33/002;
(Continued)

(56) References Cited

U.S. PATENT DOCUMENTS

2012/0068289 A1  3/2012  Alie et al.
2014/0141592 A1* 5/2014  Irsigler ............ H01L 21/76224
                                                              438/424
(Continued)

FOREIGN PATENT DOCUMENTS

JP      06-124862 A    5/1994
KR     10-0707902 B1   4/2007

OTHER PUBLICATIONS

International Search Report and Written Opinion, PCT/US2019/047760, ISA:US, Nov. 15, 2019, 12 pp.

*Primary Examiner* — Dao H Nguyen
(74) *Attorney, Agent, or Firm* — Rutan and Tucker, LLP

(57) ABSTRACT

Methods, systems, and apparatuses are described for a CMOS compatible substrate having multiple stacks of semiconductor layers. The multiple stacks, at least, each include i) a layer of a tellurium based semiconductor layer on top of ii) a porous silicon layer. The porous silicon layer is a compliant layer to accept structural defects from the tellurium based semiconductor layer into the porous silicon layer. The multiple stacks are grown on the CMOS compatible substrate.

20 Claims, 7 Drawing Sheets

(51) Int. Cl.
*H01L 31/109* (2006.01)
*H01L 31/18* (2006.01)
*H01L 33/00* (2010.01)

(52) U.S. Cl.
CPC ........ *H01L 31/1832* (2013.01); *H01L 33/002* (2013.01); *H01L 33/0087* (2013.01)

(58) Field of Classification Search
CPC ............. H01L 33/0087; H01L 31/1836; H01L 21/02381; H01L 21/0245; H01L 21/02562
See application file for complete search history.

(56) References Cited

U.S. PATENT DOCUMENTS

2016/0013391 A1   1/2016  Kato et al.
2016/0380137 A1*  12/2016 Shibata ................ H01L 31/109
                                                       257/21

* cited by examiner

B) Grow first Si layer and make the Si layer porous

```
                    ┌───────┐
                    │ Start │
                    └───┬───┘
                        │
┌───────────────────────┴────────────────────────────────────────────┐
│ The method creates a pattern of spots/deformations for each stack of │
│ semiconductor layer to grow on, where at least two or more stacks of │
│ semiconductor layers are grown on the CMOS compatible substrate.  402│
└───────────────────────┬────────────────────────────────────────────┘
                        │
┌───────────────────────┴────────────────────────────────────────────┐
│ The method creates the spots/deformations for each stack of semiconductor layer │
│ grown on the CMOS compatible substrate in a number of ways such as i) │
│ mechanical or chemical etching with a metal and/or ii) with lithography. │
│                                                                 402a │
└───────────────────────┬────────────────────────────────────────────┘
                        │
┌───────────────────────┴────────────────────────────────────────────┐
│ Multiple stacks will be grown that include 1) a layer of a tellurium based │
│ semiconductor layer on top of 2) a porous silicon layer, as a compliant layer to │
│ accept structural defects from the tellurium based semiconductor layer into the │
│ porous silicon layer, and then into the semiconductor compatible substrate. │
│                                                                  404 │
└───────────────────────┬────────────────────────────────────────────┘
                        │
┌───────────────────────┴────────────────────────────────────────────┐
│ The silicon layer for each stack is the first layer grown on the substrate. The │
│ silicon layer is then made porous.                               406 │
└───────────────────────┬────────────────────────────────────────────┘
                        │
┌───────────────────────┴────────────────────────────────────────────┐
│ The method can remove/getter one or more chemical elements from a silicon │
│ based alloy grown as a layer on the silicon substrate and then selectively removes │
│ certain chemical elements from the silicon based alloy in order for the remaining │
│ silicon to create the porous silicon layer.                     406a │
└───────────────────────┬────────────────────────────────────────────┘
                        │
┌───────────────────────┴────────────────────────────────────────────┐
│ The method can use an electro-chemical etch with electrodes and a bias voltage │
│ in each desired spot to create porous areas in the silicon layer between the silicon │
│ substrate and contact points of the electrodes to create the porous silicon layer. │
│                                                                 406b │
└───────────────────────┬────────────────────────────────────────────┘
                        │
                    ┌───┴───┐
  Fig. 4A           │ Cont. │
                    └───────┘
```

( Cont. )

The method uses an etch and lithography combination via an established technique to make deformations in the silicon layer to make it porous.
406c The method next forms a first level in the tellurium based semiconductor layer, such as a layer of mercury cadmium telluride (HgCdTe).
408

The method leaves the compliant layer of porous silicon left un-oxidized/ with open spaces, to remain compliant to allow mechanical deformation into its crystalline structure with the porous areas in the silicon to accept any defects migrating from each of the levels in the HgCdTe layer.
410

The method heats a growth chamber to elevate and then maintain a growth temperature.
412

The method creates two or more mercury cadmium telluride levels in the mercury cadmium telluride layer on each stack grown on the silicon substrate. The method creates an interface between each of the levels of mercury cadmium telluride in the mercury cadmium telluride layer. Each new level of mercury cadmium telluride that interfaces with another level varies in its characteristics from its interfacing level of mercury cadmium telluride.
414

The method may then strengthen the formed stacks after all of the levels of mercury cadmium telluride in the layer of mercury cadmium telluride are created and laid.
416

The tellurium based semiconductor layer and the porous silicon layer can both be grown on the semiconductor compatible substrate using a chemical vapor-deposition technique, a molecular beam epitaxy technique or similar technique.
418

Each of the two or more stacks grown on the substrate occupy an area of being less than ten microns total on the CMOS compatible semiconductor substrate to maximize an amount of pixels possible on the fabricated device.
420

The method may also allow for the formation of transistors for read in-read out circuits in spaces located between the stacks on the CMOS compatible substrate in accordance with the design for that wafer.
422

The wafer with multiple stacks of semiconductor layers grown on the CMOS compatible substrate are integrated into a device.
424

The method then fabricates a device with the CMOS compatible substrate with multiple stacks of semiconductor layers. The fabricated device may be i) a light emitter, ii) a light imager, and iii) any combination of both.
426

Fig. 4C    ( Cont. )

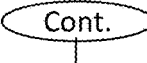

A method of creating stacks with composition and crystal structure needed for two types of devices on incompatible substrates is discussed. For example, a CMOS compatible substrate could be made of silicon, an incompatible semiconductor layer can be made of mercury cadmium telluride, and a porous layer acting as a compliant layer to accept structural defects from the incompatible layer could be a porous silicon layer. However, there are many other examples. For example, the semiconductor compatible substrate could be made of gallium arsenide and the semiconductor layer could made of Indium phosphide. The GaAs substrate could be used for high speed electronics and could be paired with an InP incompatible semiconductor layer. Also, an InP substrate could be used for high speed electronics and could be paired with a GaAs incompatible semiconductor layer. Also, the semiconductor compatible substrate could be made of a CMOS compatible silicon substrate and the semiconductor layer could be made of InP for light emitters and short wave infrared detectors. Likewise, the semiconductor compatible substrate could be made of a CMOS compatible silicon substrate and the semiconductor layer could be made of GaAs for light emitters. The incompatible layer could be one of an infrared detecting layer or a light emitting layer. These are but a few examples discussed using the same and/or very similar concepts applied herein.

428

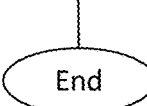

Fig. 4D

USING A COMPLIANT LAYER TO ELIMINATE BUMP BONDING

INCORPORATION BY REFERENCE

Cross-Reference

This application is a 35 U.S.C. § 371 U.S. National Stage of International Patent Application No. PCT/US2019/047760, titled "USING A COMPLIANT LAYER TO ELIMINATE BUMP BONDING" having an International Filing Date of Aug. 22, 2019 which claims priority to and benefit under 35 USC 119 of U.S. Provisional Application No. 62/775,312, titled "CMOS-compatible silicon-silicon dioxide super lattice infrared photo detectors to eliminate bump bonding," filed Dec. 4, 2018. All publications and patent applications mentioned in this specification are herein incorporated by reference in their entirety to the same extent as if each individual publication or patent application was specifically and individually indicated to be incorporated by reference.

TECHNICAL FIELD

Embodiments of this disclosure relate generally to creating semiconductor layers on a substrate.

BACKGROUND

Some semiconductors—lattice-matched to a silicon substrate—require that the integration of IR detector arrays with the silicon electronics for conditioning and reading out the detector photocurrent be done by bump-bonding. A bump-bonding technique may use pads on a detector chip mated with corresponding pads on the electronics chip through small solder balls. Bump-bonding does not scale well with increasing number of pixels in the detector array and with smaller pixel size. The solder balls tend to coalesce, rendering clusters of pixels useless because they are short-circuited to each other. But efforts to reduce the coalescing, for example by reducing the size of the solder balls, result in open circuits between the detector and the electronics.

SUMMARY

Provided herein can be various methods, apparatuses, and systems for using a porous silicon layer to eliminate bump bonding for incompatible substrates.

In an embodiment, methods, systems, and apparatuses are described for a complementary metal-oxide-semiconductor (CMOS)-compatible substrate having multiple stacks of semiconductor layers. The multiple stacks at least each include i) a layer of a tellurium based semiconductor layer on top of ii) a porous silicon layer. The porous silicon layer is a compliant layer to accept structural defects from the tellurium based semiconductor layer into the porous silicon layer. The multiple stacks are grown on the CMOS compatible substrate.

DRAWINGS

FIGS. 4A-4D illustrate an embodiment of a flow diagram for creating a semiconductor compatible substrate with multiple stacks of semiconductor layers where at least one semiconductor layer is incompatible with the substrate but utilizes a porous layer to eliminate bump bonding.

Figure 1:
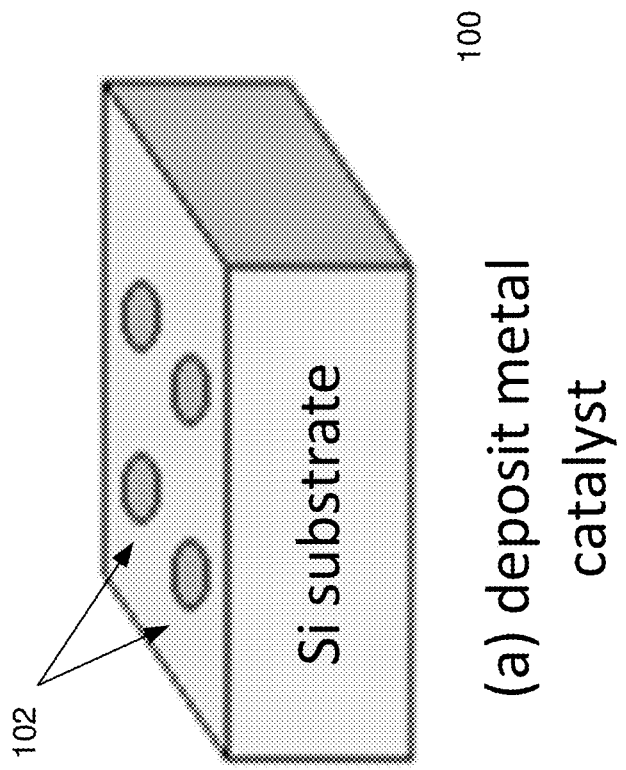
FIG. 1 illustrates an embodiment of a block diagram of a CMOS-compatible substrate, where each stack of semiconductor layer is grown on alterations in the silicon substrate where atoms are removed from the material.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DETAILED DESCRIPTION

In the following description, numerous specific details can be set forth, such as examples of specific data signals, named components, etc., in order to provide a thorough understanding of the present design. It will be apparent, however, to one of ordinary skill in the art that the present design can be practiced without these specific details. In other instances, well known components or methods have not been described in detail but rather in a block diagram in order to avoid unnecessarily obscuring the present design. Further, specific numeric references such as the first photodiode, can be made. However, the specific numeric reference should not be interpreted as a literal sequential order but rather interpreted that the first photodiode is different than a second photodiode. Thus, the specific details set forth can be merely exemplary. The specific details can be varied from and still be contemplated to be within the spirit and scope of the present design. The term "coupled" is defined as meaning connected either directly to the component or indirectly to the component through another component.

In general, we are describing a method of creating stacks with composition and crystal structure needed for two types of devices on incompatible substrates. For example, a CMOS compatible substrate could be made of silicon, an incompatible semiconductor layer can be made of mercury cadmium telluride, and a porous layer acting as a compliant layer to accept structural defects from the incompatible layer could be a porous silicon layer. However, there are many other examples.

For example, the semiconductor compatible substrate could be made of gallium arsenide and the semiconductor layer could made of Indium phosphide. The GaAs substrate could be used for high speed electronics and could be paired with an InP incompatible semiconductor layer. Also, an InP substrate could be used for high speed electronics and could be paired with a GaAs incompatible semiconductor layer. Also, the semiconductor compatible substrate could be made of a CMOS compatible silicon substrate and the semiconductor layer could be made of InP for light emitters and short wave infrared detectors. Likewise, the semiconductor compatible substrate could be made of a CMOS compatible silicon substrate and the semiconductor layer could be made of GaAs for light emitters. The incompatible layer could be one of an infrared detecting layer or a light emitting layer. These are but a few examples.

As an illustrative example methods, apparatuses, and systems are discussed for a CMOS compatible substrate with multiple stacks of semiconductor layers. An example for a mercury cadmium telluride incompatible semiconductor layer and a semi-conductor compatible substrate made of silicon will be discussed in detail below. However, the same and/or very similar concepts can be applied to the other examples herein.

FIG. 1 illustrates an embodiment of a block diagram of a CMOS-compatible substrate, where each stack of semiconductor layer is grown on alterations in the silicon substrate where atoms are removed from the material. The CMOS-compatible substrate 100 has multiple stacks of semiconductors. Each stack may include at least i) a layer of a tellurium based semiconductor layer on top of ii) a porous silicon layer (see FIGS. 2 and 3), which can be grown on alterations 102 in the silicon substrate 100 created by a process, such as mechanical or chemical etching.

In an example, the mechanical etching with a metal into the softer silicon leaves alterations 102. The dots/alterations 102 will have a diameter equal to the desired stack diameter (E.g. 1-10 μm) on the substrate 100.

In another example, a metal catalyst may be used to form the alterations 102 in the silicon substrate 100. The process begins by depositing dots/alterations 102 with a pre-determined pattern via one of the example techniques above. The dots/alterations 102 will have a diameter equal to the desired stack diameter (E.g. 1-10 μm) on the substrate 100. The metal used for Si and Ge growth can often be Au, but Al, Ni, and other metals can also be used. In an example process, when the source gas is introduced with the substrate heated at the growth temperature, the gas molecule dissociates at the metal surface with the Si atom mixing with the metal and H atoms in the gas can go into the vapor phase. The mixture becomes a liquid when the Si concentration in the mixture is high enough. With further increase in the Si concentration, the liquid becomes saturated and therefore the excess Si precipitates out leaving an alteration 102. Each stack of semiconductor layer may grow upon the dots/alterations 102 in the silicon substrate 100.

In another example, lithography patterns may be used to create the alterations 102 in the silicon substrate 100 to grow the regularly spaced stacks. Again, the dots/alterations 102 will have a diameter equal to the desired stack diameter (E.g. 1-10 μm) on the substrate 100.

The resulting apparatus and methods may be used with silicon based (Si) infrared (IR) detectors responsive to wavelengths from about 1.2 μm to beyond 14 μm. This CMOS compatible substrate with multiple stacks of semiconductor layers process can be used for; and thus eliminates the need to bump-bond, an IR detector array fabricated from semiconductor alloys, such as HgCdTe and porous silicon, all on a silicon read-out integrated circuit (ROIC). IR imagers based on this technology can have the IR detectors monolithically integrated with the ROIC; and thus, will have smaller pixel size, larger format, and will be more mechanically robust and less expensive than state-of-the-art IR imagers.

IR photon detectors may use very high-quality semiconductors from this process to achieve performance needed for low-noise and high-sensitivity imagery. This process using semiconductor stacks matched to a silicon substrate may integrate an IR detector array with the silicon electronics for conditioning and reading out the detector photocurrent. This process does scale well with increasing number of pixels in the detector array and with smaller pixel size. The individual stacks stay where formed and do not cluster or coalesce to render a pixel useless.

Figure 2:
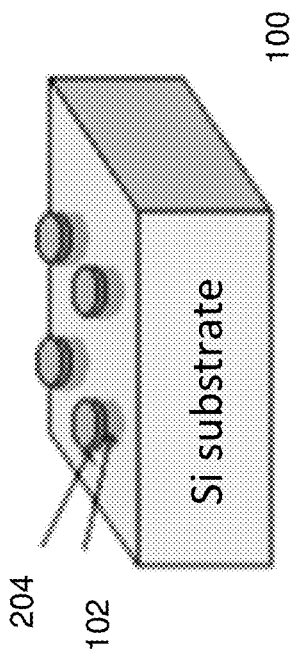
FIG. 2 illustrates an embodiment of a block diagram of multiple stacks that at least each include i) a layer of a tellurium based semiconductor layer on top of ii) a porous silicon layer grown on the CMOS compatible substrate.

FIG. 2 illustrates an embodiment of a block diagram of multiple stacks that at least each include i) a layer of a tellurium based semiconductor layer on top of ii) a porous silicon layer grown on a CMOS compatible substrate.

The multiple stacks at least include i) a layer of a tellurium based semiconductor layer on top of ii) a porous silicon layer 204, as a compliant layer to accept structural defects from the tellurium based semiconductor layer into the porous silicon layer 204. The silicon layer is the first layer grown on the substrate 100. The silicon layer is then made porous and becomes the porous silicon layer 204.

The porous silicon layer 204 can act as a mechanically soft compliant layer to accept structural defects from the tellurium based semiconductor layer into the porous silicon layer 204. Defects should be confined to compliant layer and not enter substrate The semiconductor compatible substrate 100 can be made of silicon (Si) or another CMOS compatible element. The tellurium based semiconductor layer can be made of mercury cadmium telluride (HgCdTe). The porous silicon layer 204 can start off with an alloy such as SiGe, and or as a pure silicon layer. A number of example methods can be used to create the porous silicon layer 204 on the silicon substrate.

For example, the process can grow a layer of a silicon alloy, which then has non-silicon elements removed from that layer to make a porous silicon layer 204. The porous silicon layer 204 that acts as the mechanically soft compliant layer can be created via gettering/removing one or more chemical elements from a silicon based alloy grown as a layer on the silicon substrate in order for the remaining silicon to create the porous silicon layer 204.

Another example, the porous silicon layer 204 that acts as a mechanically soft compliant layer can also be created via using an electro-chemical etch with electrodes and a bias voltage in each desired spot to create a porous areas in a silicon layer between the silicon substrate and contact points of the electrodes to create the porous silicon layer 204.

Another example, the porous silicon layer 204 that acts as a mechanically soft compliant layer can also be created via using an etch and lithography combination to make alterations in a silicon layer to create the porous silicon layer 204.

In an embodiment, the two or more formed stacks each occupy an area of that stack being less than ten micrometers total on the CMOS compatible semiconductor substrate 100 to maximize an amount of pixels possible on the fabricated i) light emitter ii) light detector; and iii) any combination of both.

Note, each formed stack in the CMOS compatible semiconductor substrate 100 can occupy an area of less than ten micrometers total also to expose atoms of undesired elements in the silicon layer to allow them to be removed from the silicon semiconductor layer to make the porous silicon semiconductor layer 204.

Note, stacks with semiconductor layers are grown on designated/desired spots on the wafer in accordance with a pattern dictated by the intended performance of the overall assembly, rather than growing a silicon layer and then a telluride layer that both extend over the whole wafer. Limiting the growth to stacks increases the effectiveness of the porous silicon layer as a compliant layer.

The tellurium based semiconductor layer and porous silicon layer 204 may be grown on the semiconductor compatible substrate 100 using a chemical vapor-deposition technique or the molecular beam epitaxy technique.

Figure 3:
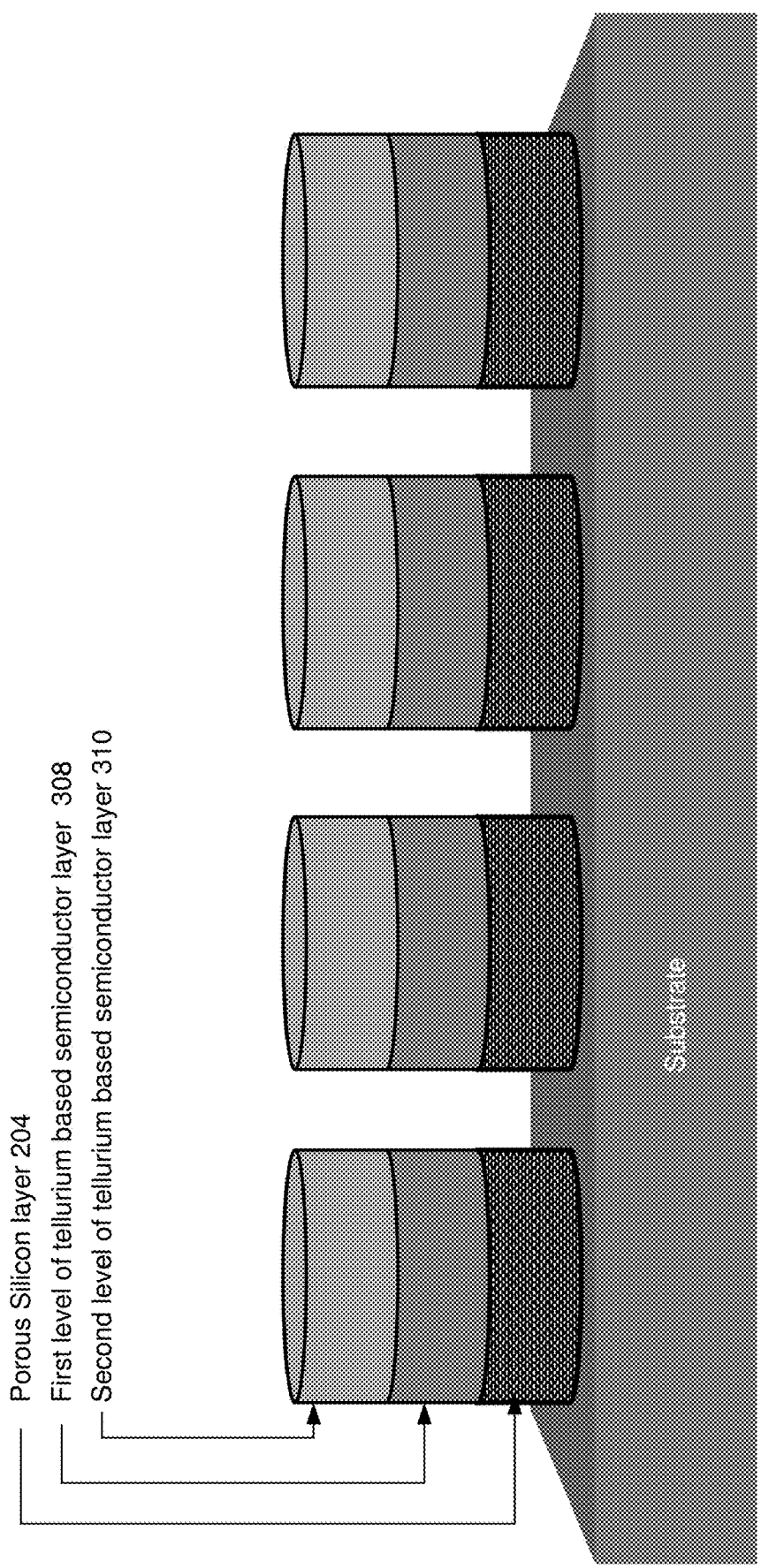
FIG. 3 illustrates an embodiment of a block diagram of two or more stacks grown on the silicon substrate and each stack has two or more mercury cadmium telluride levels in the mercury cadmium telluride layer and an interface between two levels of mercury cadmium telluride.

FIG. 3 illustrates an embodiment of a block diagram of two or more stacks grown on the silicon substrate and each stack has two or more mercury cadmium telluride levels in the mercury cadmium telluride layer and an interface between two levels of mercury cadmium telluride.

Again, a telluride based layer is grown on the porous silicon layer 204, which acts as a compliant layer to accept defects from the grown telluride layer into the porous and crystalline structure of the porous silicon layer 204. For simplicity, only one layer of the tellurium based semiconductor layer on top of the porous silicon layer 204 is shown. Additional layers of porous silicon and telluride based layers can be grown on each stack if desired.

Each stack can have two or more mercury cadmium telluride levels in the mercury cadmium telluride layer and an interface between two levels of mercury cadmium telluride. Each level of mercury cadmium telluride that interfaces with each other varies in its characteristics from its interfacing level of mercury cadmium telluride. For example, the first level of tellurium based semiconductor layer 308 interfaces with the second level of tellurium based semiconductor layer 310.

Each interfacing level of mercury cadmium telluride in the mercury cadmium telluride layer can be created by 1) having a different level of doping between the interfacing levels of mercury cadmium telluride, and/or 2) having each interfacing level of mercury cadmium telluride to be composed of a different ratio of mercury to cadmium from each other, such as $Hg_{0.40}Cd_{0.60}Te$, $Hg_{0.45}Cd_{0.55}Te$, etc.

An alternate approach can be used besides the mercury cadmium telluride where other materials can be used. For example, GaAS and AlGaAs or InGaAs and InAlAs are used in quantum well IR photodetectors (QWIPs), which can detect photons with energy smaller than the bandgap of its constituents. The absorption band of a QWIP can be widely tuned by varying the thickness of the individual Si layer and characteristics of the levels within the mercury cadmium telluride layer to cover the IR from the cutoff of the band-to-band absorption of bulk Si near 1.2 μm to beyond 14 μm.

The methods, systems and apparatus discussed herein can make QWIPs that are responsive to structure-dependent wavelength bands ranging from 1.2 μm to beyond 14 μm, that are matched to a silicon substrate and that are compatible with a standard CMOS integrated circuit process.

The CMOS compatible substrate with its multiple stacks can be incorporated into i) a light emitter, ii) a light imager, and iii) any combination of both.

Thus, a monolithic integration of IR detectors with their read-out electronics should fit seamlessly within a CMOS process in terms of material compatibility, thermal budget, and wafer planarity. The approach can create a mercury cadmium telluride photodiode or photoconductor as an IR photon detector that can be monolithically integrated with a Si read-out circuit.

FIGS. 4A-4D illustrate an embodiment of a flow diagram for creating a semiconductor compatible substrate with multiple stacks of semiconductor layers where at least one semiconductor layer is incompatible with the substrate but utilizes a porous layer to eliminate bump bonding. A method of creating stacks with composition and crystal structure needed for two types of devices on incompatible substrates is discussed. Some or all of the steps of the method to create the substrate with multiple stacks of semiconductor layers on the substrate may be performed. The steps need not be performed in a sequential order where logically possible. The method can be performed by a fabrication system.

In step 402, the method creates a pattern of spots/alterations for each stack of semiconductor layer to grow on, where at least two or more stacks of semiconductor layers are grown on the CMOS compatible substrate. The spots/alterations, for each stack of semiconductors to grow on, are purposely spaced from each other to prevent coalescing/merging between adjoining stacks, minimizing short circuits and leakage between electrical traces routed to each stack, all while maximizing an amount of resulting pixels on a wafer.

In step 402a, the method creates the spots/alterations for each stack of semiconductor layer grown on the CMOS compatible substrate in a number of ways such as i) mechanical or chemical etching with a metal and/or ii) with lithography.

In an example process, mechanical or chemical etching with a metal into the silicon substrate is performed to shape the spots/areas by creating alterations into the silicon substrate for the multiple stacks to grow on. In addition, the process may use lithography to shape areas into the silicon substrate to grow the stacks of semiconductor layers on.

In step 404, multiple stacks will be grown that include 1) a layer of a tellurium based semiconductor layer on top of 2) a porous silicon layer, as a compliant layer to accept structural defects from the tellurium based semiconductor layer into the porous silicon layer.

In step 406, the silicon layer for each stack is the first layer grown on the substrate. The silicon layer is then made porous. The method creates a porous silicon layer for a well in a top surface of the silicon layer, where the porous silicon layer that acts as a mechanically soft compliant layer is created via one of three example techniques. The method creates each porous silicon layer in the stack by example techniques.

In step 406a, in an example technique, the method removes/getters one or more chemical elements from a silicon based alloy, such as $Si_{0.46}Ge_{0.54}$, grown as a layer on the silicon substrate and then selectively removes certain chemical elements, such as the Ge, from the silicon based alloy in order for the remaining silicon to create the porous silicon layer.

In step 406b, in an example technique, the method uses an electro-chemical etch with electrodes and a bias voltage in each desired spot to create porous areas in the silicon layer between the silicon substrate and contact points of the electrodes to create the porous silicon layer.

In step 406c, in an example technique, the method uses an etch and lithography combination via an established technique to make alterations in the silicon layer to make it porous.

In step 408, the method next forms a first level in the tellurium based semiconductor layer, such as a layer of mercury cadmium telluride (HgCdTe).

In step 410, the method leaves the compliant layer of porous silicon left un-oxidized/with open spaces, to remain compliant to allow mechanical alteration into its crystalline structure with the porous areas in the silicon to accept any defects migrating from each of the levels in the HgCdTe layer.

In step 412, the method heats a growth chamber to elevate and then maintain a growth temperature 150°-350° C. for HgCdTe to grow one or more levels of mercury cadmium telluride in the mercury cadmium telluride layer while at a same time migrating process-induced defects from the mercury cadmium telluride layer into the compliant porous silicon layer. The porous silicon layer easily strains to accommodate the difference in lattice parameters of the mercury cadmium telluride layer above it and the silicon substrate below it.

In step 414, the method creates two or more mercury cadmium telluride levels in the mercury cadmium telluride layer on each stack grown on the silicon substrate. The method creates an interface between each of the levels of mercury cadmium telluride in the mercury cadmium telluride layer. Each new level of mercury cadmium telluride that interfaces with another level varies in its characteristics from its interfacing level of mercury cadmium telluride. Each interfacing level of mercury cadmium telluride in the mercury cadmium telluride layer can be created by 1) having a different level of doping between the interfacing levels of mercury cadmium telluride via turning valves for reactant gases on and off at appropriate set times, and/or 2) having each interfacing level of mercury cadmium telluride to be composed of a different composition/ratio of mercury to cadmium, such as $Hg_{0.40}Cd_{0.60}Te$ from each other via changing the ratio of gas flows of Hg gas and Te gas during a particular level of growth of the HgCdTe layer. This will change a chemical composition and ratio of Hg to Cd from its interfacing layer of HgCdTe.

Thus, the method creates one or more additional mercury cadmium telluride levels in the mercury cadmium telluride layer and creates an interface between levels of mercury cadmium telluride.

In step 416, the method may then strengthen the formed stacks after all of the levels of mercury cadmium telluride in the layer of mercury cadmium telluride are created and laid. The method may then strengthen the formed stacks via a technique such as thermal oxidization. The oxidizing agent can diffuse rapidly through the pores in the porous silicon layers to enhance the oxidation rate of the porous silicon over that of the mercury cadmium telluride layer and the silicon substrate. The porous silicon layer compliantly absorbs/accepts all or most of the defects from the mercury cadmium telluride layer during the creation and growth of that layer. What remains of the porous silicon layer can be filled with a chemical element or compound that strengthens the porous silicon by forming chemical bonds that bridge silicon atoms across the pores. The porosity can create a stress-free structure by compensating for any volume change during growth or subsequent strengthening.

In step 418, note, the tellurium based semiconductor layer and the porous silicon layer can both be grown on the semiconductor compatible substrate using a chemical vapor-deposition technique, a molecular beam epitaxy technique or similar technique.

In step 420, each of the two or more stacks grown on the substrate occupy an area of being less than ten microns total on the CMOS compatible semiconductor substrate to maximize an amount of pixels possible on the fabricated i) light emitters (e.g. lasers) ii) light detectors/imagers, and iii) any combination of both. Each formed stack occupies a small area (e.g. each less than 10 um diameter on the substrate to maximize an amount of pixels possible on the fabricated device as well as allow easy removal of atoms of elements to make the porous silicon layer.

In step 422, the method may also allow for the formation of transistors for read in-read out circuits in spaces located between the stacks on the CMOS compatible substrate in accordance with the design for that wafer. The method may also perform testing using the read in-read out circuits on each fabricated wafer.

In step 424, the wafer with multiple stacks of semiconductor layers grown on the CMOS compatible substrate are integrated into a device. The method can integrate the CMOS compatible substrate and the multiple stacks of at least a layer of the tellurium based semiconductor layer on top of the porous silicon layer, all grown on the CMOS compatible semiconductor substrate, into the CMOS process that creates i) the light emitters, ii) the light detectors/imagers, and iii) any combination of both.

In step 426, the method then fabricates a device with the CMOS compatible substrate with multiple stacks of semiconductor layers. The fabricated device may be i) a light emitter, ii) a light imager, and iii) any combination of both. The fabricated i) light emitters (lasers) ii) light detectors/imagers have a high quantum efficiency, which is a measure of how efficiently the sensor converts light (photons) to charge (electrons). The more electrons in a pixel during the integration period, the higher the output level of the sensor, so the more sensitive the sensor is for that specific wavelength of the light.

In step 428, variations on the method can easily be made. A method of creating stacks with composition and crystal structure needed for two types of devices on incompatible substrates is discussed. For example, a CMOS compatible substrate could be made of silicon, an incompatible semiconductor layer can be made of mercury cadmium telluride, and a porous layer acting as a compliant layer to accept structural defects from the incompatible layer could be a porous silicon layer. However, there are many other examples. For example, the semiconductor compatible substrate could be made of gallium arsenide and the semiconductor layer could made of Indium phosphide. The GaAs substrate could be used for high speed electronics and could be paired with an InP incompatible semiconductor layer. Also, an InP substrate could be used for high speed electronics and could be paired with a GaAs incompatible semiconductor layer. Also, the semiconductor compatible substrate could be made of a CMOS compatible silicon substrate and the semiconductor layer could be made of InP for light emitters and short wave infrared detectors. Likewise, the semiconductor compatible substrate could be made of a CMOS compatible silicon substrate and the semiconductor layer could be made of GaAs for light emitters. The incompatible layer could be one of an infrared detecting layer or a light emitting layer. These are but a few examples discussed using the same and/or very similar concepts applied herein.

References in the specification to "an embodiment," "an example", etc., indicate that the embodiment or example described may include a particular feature, structure, or characteristic, but every embodiment may not necessarily include the particular feature, structure, or characteristic. Such phrases can be not necessarily referring to the same embodiment. Further, when a particular feature, structure, or characteristic is described in connection with an embodiment, it is believed to be within the knowledge of one skilled in the art to affect such feature, structure, or characteristic in connection with other embodiments whether or not explicitly indicated.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

The invention claimed is:

1. An apparatus, comprising:
   a semiconductor compatible substrate that has multiple alterations in the semiconductor compatible substrate, where each of the alterations has a diameter equal to a desired stack diameter on the semiconductor compatible substrate, and
   multiple stacks that at least each include i) a layer incompatible with the semiconductor compatible substrate, where the incompatible layer is on top of ii) a porous layer, where the porous layer is configured as a compliant layer to accept structural defects from the incompatible layer, where the multiple stacks are on top the semiconductor compatible substrate.

2. The apparatus of claim 1, where the semiconductor compatible substrate is made of silicon and the incompatible layer is made of mercury cadmium telluride.

3. The apparatus of claim 2, where the alterations in the semiconductor compatible substrate, which is made of silicon, were formed to grow the multiple stacks of i) the mercury cadmium telluride semiconductor layer on top of ii) the porous layer, which is made of silicon, and where the alterations in the semiconductor compatible substrate made of silicon were created by etching with a metal catalyst.

4. The apparatus of claim 2, where the porous layer, which is made of silicon and configured to act as the compliant layer was created via gettering one or more chemical elements from a silicon based alloy grown as a layer on the semiconductor compatible substrate, which is made of silicon, in order for the remaining silicon to create the porous silicon layer.

5. The apparatus of claim 2, where the porous layer, which is made of silicon and configured to act as the compliant layer was created via using an electro-chemical etch with electrodes and a bias voltage in each desired spot to create porous areas in a silicon layer between the semiconductor compatible substrate, which is made of silicon, and contact points of the electrodes to create the porous silicon layer.

6. The apparatus of claim 2, where the porous layer, which is made of silicon and configured to act as the compliant layer was created via using an etch and lithography combination to make the alterations in a silicon layer to create the porous silicon layer.

7. The apparatus of claim 2, where a first stack grown on the semiconductor compatible substrate, which is made of silicon, has two or more mercury cadmium telluride levels in the mercury cadmium telluride layer and an interface between two levels of mercury cadmium telluride.

8. The apparatus of claim 2, where the incompatible layer would be one of an infrared detecting layer or a light emitting layer.

9. The apparatus of claim 1, where the semiconductor compatible substrate is made of gallium arsenide and the layer incompatible with the semiconductor compatible substrate is made of indium phosphide.

10. The apparatus of claim 1, where the semiconductor compatible substrate is made of silicon and the layer incompatible with the semiconductor compatible substrate is made of indium phosphide.

11. A method to create a semiconductor compatible substrate with stacks of semiconductor layers on the semiconductor compatible substrate, comprising:
    growing multiple stacks that at least include i) a layer of a semiconductor layer on top of ii) a porous silicon layer, where the porous silicon layer acts as a compliant layer to accept structural defects from the semiconductor layer, which is incompatible with the semiconductor compatible substrate, into the porous silicon layer, where the semiconductor layer and the porous silicon layer are grown on top of the semiconductor compatible substrate, where the semiconductor compatible substrate that has multiple alterations in the semiconductor compatible substrate, where each of the alterations has a diameter equal to a desired stack diameter on the semiconductor compatible substrate, and
    fabricating a wafer containing the semiconductor compatible substrate with the multiple stacks of semiconductor layers.

12. The method of claim 11, where the semiconductor compatible substrate is made of silicon and the layer incompatible with the semiconductor compatible substrate is made of mercury cadmium telluride.

13. The method of claim 12, where two or more stacks are created by:
    chemical etching with a metal into the semiconductor compatible substrate, which is made of silicon, to shape areas, by creating the alterations into the silicon semiconductor compatible substrate, for the multiple stacks to grow on.

14. The method of claim 13, where the porous silicon layer is created by using any one of the following:
    i) gettering one or more chemical elements from a silicon based alloy grown as a layer on the semiconductor compatible substrate, which is made of silicon, and then removing certain chemical elements from the silicon based alloy in order for the remaining silicon to create the porous silicon layer,
    ii) using an electro-chemical etch with electrodes and a bias voltage in each desired spot to create porous areas in a silicon layer between the semiconductor compatible substrate, which is made of silicon, and contact points of the electrodes to create the porous silicon layer, and
    iii) using an etch and lithography combination to make alterations in the silicon layer to make areas within the silicon layer porous.

15. The method of claim 14, where two or more stacks grown on the semiconductor compatible substrate, which is made of silicon, are further created by:
    heating a growth chamber to elevate and then maintain a growth temperature to grow one or more levels of mercury cadmium telluride in the mercury cadmium telluride layer while at a same time migrating process-induced defects from the mercury cadmium telluride layer into a porous silicon layer, where silicon crystals within the porous silicon layer move atoms into open areas, via alternation, to accept lattice parameters of the mercury cadmium telluride layer.

16. A light detector created by the method of claim 12.

17. The apparatus of claim 11, where the semiconductor compatible substrate is made of gallium arsenide and the layer incompatible with the semiconductor compatible substrate is made of indium phosphide.

18. The method of claim 11, where the stacks are grown using a chemical vapor-deposition technique or a molecular beam epitaxy technique.

19. The method of claim 11, further comprising:
    forming transistors for read in-read out circuits in spaces located between the multiple stacks grown on the semiconductor compatible substrate.

20. A light emitter created by the method of claim 11.

* * * * *